(12) United States Patent
Mandelman et al.

(10) Patent No.: US 6,518,641 B2
(45) Date of Patent: Feb. 11, 2003

(54) DEEP SLIT ISOLATION WITH CONTROLLED VOID

(75) Inventors: Jack A. Mandelman, Stormville, NY (US); Ramachandra Divakaruni, Somers, NY (US); Johnathan E. Faltermeier, Lagrange, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/861,274

(22) Filed: May 18, 2001

(65) Prior Publication Data

US 2002/0171118 A1 Nov. 21, 2002

(51) Int. Cl.[7] .............................................. H01L 29/00
(52) U.S. Cl. .................... 257/510; 257/514; 257/516; 257/522
(58) Field of Search ................ 257/410, 411, 257/386, 900, 522, 516, 514, 510, 302; 438/427, 221, 646, 648, 200, 287, 244

(56) References Cited

U.S. PATENT DOCUMENTS

| | | | |
|---|---|---|---|
| 4,546,538 A | 10/1985 | Suzuki | |
| 4,808,550 A | 2/1989 | Fukushima | |
| 4,855,017 A * | 8/1989 | Douglas | 204/192.37 |
| 4,984,039 A * | 1/1991 | Douglas | 257/296 |
| 5,098,856 A | 3/1992 | Beyer et al. | |
| 5,208,657 A * | 5/1993 | Chatterjee et al. | 257/302 |
| 5,227,658 A | 7/1993 | Beyer et al. | |
| 5,232,866 A | 8/1993 | Beyer et al. | |
| 5,262,354 A | 11/1993 | Cote et al. | |
| 5,306,659 A | 4/1994 | Beyer et al. | |
| 5,382,541 A | 1/1995 | Bajor et al. | |
| 5,391,911 A | 2/1995 | Beyer et al. | |
| 5,451,809 A * | 9/1995 | Shiozawa et al. | 257/301 |
| 5,510,645 A | 4/1996 | Fitch et al. | |
| 5,719,085 A * | 2/1998 | Moon et al. | 148/DIG. 50 |
| 5,880,018 A | 3/1999 | Boeck et al. | |
| 5,933,746 A | 8/1999 | Begley et al. | |
| 5,933,753 A | 8/1999 | Simon et al. | |
| 5,937,292 A * | 8/1999 | Hammerl et al. | 438/243 |
| 5,972,758 A | 10/1999 | Liang | |
| 5,981,382 A | 11/1999 | Konecni et al. | |
| 5,985,763 A | 11/1999 | Hong et al. | |
| 6,001,695 A | 12/1999 | Wu | |
| 6,015,746 A | 1/2000 | Yeh et al. | |
| 6,057,202 A | 5/2000 | Chen et al. | |
| 6,060,389 A | 5/2000 | Brennan et al. | |
| 6,071,810 A | 6/2000 | Wada et al. | |
| 6,103,591 A | 8/2000 | Kagamihara | |
| 6,127,712 A | 10/2000 | Wu | |
| 6,140,207 A | 10/2000 | Lee | |
| 6,150,212 A | 11/2000 | Divakaruni et al. | |
| 6,153,935 A | 11/2000 | Edelstein et al. | |
| 6,284,665 B1 * | 9/2001 | Lill et al. | 438/710 |
| 6,331,494 B1 * | 12/2001 | Olson et al. | 438/513 |
| 2001/0023134 A1 * | 9/2001 | Akatsu et al. | 438/745 |

* cited by examiner

*Primary Examiner*—Michael S. Lebentritt
(74) *Attorney, Agent, or Firm*—Scully, Scott, Murphy & Presser; Todd M.C. Li

(57) ABSTRACT

An isolation region for a memory array in which the isolation region includes at least one trench region having sidewalls that extend to a bottom surface and a slit region formed beneath the final trench region, wherein the slit region is narrower than the overlying trench regions and has a void formed intentionally therein is provided.

19 Claims, 11 Drawing Sheets

DEEP SLIT ISOLATION WITH CONTROLLED VOID

FIELD OF THE INVENTION

The present invention relates to semiconductor device manufacturing, and in particular to a method of fabricating a deep slit isolation region that includes a void intentionally formed within a lower portion of the isolation region. The present invention also relates to the deep slit isolation region formed by the inventive method as well as semiconductor structures that include the inventive deep slit isolation region.

BACKGROUND OF THE INVENTION

As integrated circuit (IC) device technology has advanced and IC dimensions have become smaller and smaller, it has become increasingly common within advanced ICs to employ trench isolation methods such as shallow trench isolation (STI) methods and recessed oxide isolation (ROI) methods to form trench isolation regions that are nominally coplanar with adjoining active semiconductor device regions of semiconductor substrates. However, recent advances in semiconductor technologies have required deeper isolation regions driven by vertical transistors in dynamic random access memory (DRAM) devices. Conventional methods have only allowed the shallow trench isolation to reach depths of about 2500 Å because it is difficult to etch a deep trench region with a resist mask and it is also difficult to fill the etched deep trench region with a dielectric fill material such as an oxide. There is therefore a need for developing an improved method for forming deep trench isolation regions.

This is especially the case wherein vertical transistor devices having longer channel lengths are desired; longer channel lengths typically result in a semiconductor structure having lower off-state leakage as compared with vertical transistor devices having short channel lengths. Lower off-state leakage thus drives the need for deeper isolation regions between the devices. It is well known in the art that a deep trench region may be etched into a semiconductor substrate using an oxide hardmask on top of a pad nitride layer. Recent advancements in the field of fabricating trench isolation regions include the methods described in U.S. Pat. No. 6,140,207 to Lee and U.S. Pat. No. 6,150,212 to Divakaruni, et al. Specifically, the '207 patent is directed to a method of forming isolation regions within a semiconductor device that includes the steps of forming a masking layer on a semiconductor substrate, said masking layer defining field areas and active areas; forming a first trench and a second trench in the field areas of the semiconductor substrate, wherein the first trench has a width that is greater than that of the second trench; and forming an insulating layer in the first and second trench, wherein the insulating layer formed in the second trench has a void beneath a surface of the semiconductor substrate.

Although the '207 patent discloses a means for providing an isolation region in a semiconductor substrate that has a void formed therein, the '207 patent does not provide a means for allowing electrical continuity of the adjacent P-well, nor does it provide a means for avoiding charge loss due to floating well effects. Moreover, the '207 patent does not provide a trench isolation region which results in lower support sheet resistivity.

The '212 patent mentioned above relates to a method for forming an isolation trench region in a semiconductor substrate which includes the steps of: providing a trench region in a semiconductor substrate; forming a spacer material at least along sidewalls of the trench region; etching the trench region at the bottom surface so as to extend the trench region beyond the bottom surface thereby forming a crevice region beneath the trench region; and heating the spacer material such that the spacer material flows from the sidewalls of the trench region into the crevice region. Note that the '212 patent teaches away from intentionally forming a void in the trench region.

In view of the above, there is a need for providing a method of forming isolation regions which allows for electrical continuity of the adjoining array P-well, avoids charge loss due to floating well effects, results in lower support sheet resistivity and reduces noise for low-voltage applications.

SUMMARY OF THE INVENTION

One object of the present invention is to provide sub-minimum width/high aspect ratio isolation for contemporary applications using minimum lithographic image sizes.

A further object of the present invention is to provide isolation regions that enable extreme scaling (below a feature size, F of about 90 nm).

A yet further object of the present invention is to provide isolation regions that have improved latch-up immunity.

Another object of the present invention is to provide isolation regions that have a low-dielectric constant associated therewith which provides for reduced coupling at small groundrules.

These and other objects and advantages are achieved in the present invention by providing isolation regions in which the isolation regions include at least one trench region having sidewalls that extend to a bottom surface and a slit region formed beneath the final trench region, said slit region being narrower than the overlying trench regions and having a void formed therein.

One aspect of the present invention relates to a method of forming the inventive deep slit isolation region in a surface of a semiconductor substrate which includes the steps of:

(a) forming a first trench region in a surface of a substrate, said first trench region having sidewalls extending to a bottom surface;

(b) forming first spacers on said sidewalls of said first trench region;

(c) forming a slit region through said bottom surface of said first trench region, said slit region having a narrower width than said first trench region; and (d) filling said first trench region and said slit region with at least one dielectric material so as to form a void within said slit region.

Following the above filling step, the inventive method may also include a planarizing step. In one embodiment of the present invention, a plurality of trenches, in addition to the first trench region, is formed in the substrate prior to forming the slit region. In such an embodiment, wherein a plurality of trenches is formed in the substrate, each successive trench region has a narrower width than the preceding trench region and the final trench region has an adjoining slit region that is formed through the bottom surface thereof.

Another aspect of the present invention relates to an isolation region (hereinafter referred to as a "deep slit isolation region") which is prepared from the inventive method. Specifically, the inventive deep slit isolation region comprises:

a first trench region having sidewalls extending to a first shoulder region; and a slit region extending from said first shoulder region, wherein said first trench region and said slit region are filled with at least one dielectric material, and said slit region contains a void therein.

In one embodiment of the present invention, a plurality of trench regions, in addition to the first trench region, is present above the slit region. In such an embodiment, each successive trench region has a width that is narrower than the preceding trench region, and the final trench region would include the slit region formed form the shoulder region thereof.

Another aspect of the present invention relates to a memory cell such as a DRAM which includes at least one of the inventive deep slit isolation regions therein. Specifically, the memory cell of the present invention comprises:

at least a pair of active device regions which include a plurality of spaced apart vertical dynamic random access memory cells, wherein said pair of active device regions are isolated from each other by an adjoining deep slit isolation region, said deep slit isolation region comprising a first trench region having sidewalls extending to a first shoulder region; and a slit region extending from said first shoulder region, wherein said first trench region and said slit region are filled with at least one dielectric material, and said slit region contains a void therein.

As indicated above, the deep slit isolation region may include a plurality of trench regions, in addition to the first trench region, which have the aforementioned characteristics. In such an embodiment, the last trench region includes the slit region extending from the shoulder region thereof.

DETAILED DESCRIPTION OF THE INVENTION

Figure 1A:
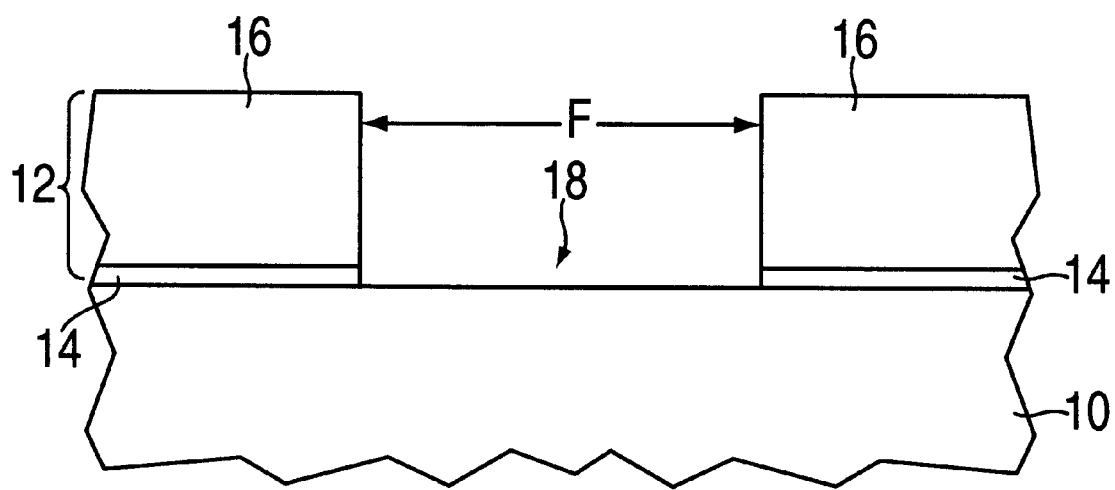
FIGS. 1A–1G are pictorial representations (through cross-sectional views) showing the fabrication of the inventive deep slit isolation region through the various processing steps of the present invention. Note that in these drawing, the second trench region is optional.
Figure 1B:
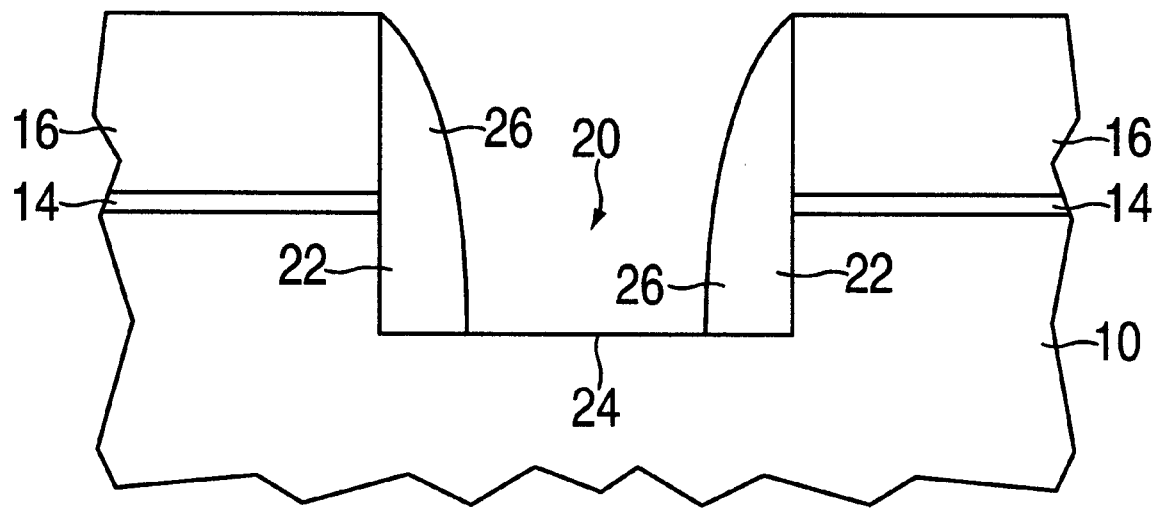

The present invention, which provides a deep slit isolation region and a method of forming the same, will now be described in more detail by referring to the drawings that accompany the present application. Note that in the accompanying drawings like and/or corresponding elements are referred to by like reference numerals.

Reference is first made to FIGS. 1A–1G which are pictorial representations (through cross-sectional views) showing the fabrication of the inventive deep slit isolation region through various processing steps of the present invention. Specifically, FIG. 1A shows an initial structure that is employed in the present invention in forming the inventive deep slit isolation region. The initial structure shown in FIG. 1A comprises semiconductor substrate 10 having patterned material stack 12 formed thereon.

The structure shown in FIG. 1A is comprised of conventional materials well known in the art and conventional processes that are also well known in the art are employed in fabricating the same. For example, semiconductor substrate 10 comprises any semiconducting material including, but not limited to: Si, Ge, SiGe, GaAs, InAs, InP and all other III/V compound semiconductors. Layered substrates comprising the same or different semiconducting material such as Si/Si or Si/SiGe, and silicon-on-insulators (SOIs) are also contemplated herein. The substrate may be of the n or p-type depending on the desired device to be fabricated. In one preferred embodiment, semiconductor substrate 10 is comprised of Si.

Patterned material stack 12, which includes pad oxide layer 14 and pad nitride layer 16, is then formed on a surface of semiconductor substrate 10 utilizing processing steps well known in the art. For example, the pad oxide layer is first formed on the surface of semiconductor substrate 10 utilizing a conventional deposition process such as chemical vapor deposition (CVD), plasma-assisted CVD, sputtering, evaporation or chemical solution deposition. Alternatively, a conventional thermal oxidation process may be employed in growing pad oxide layer 14 on a surface of semiconductor substrate 10. The thickness of pad oxide layer 14 is not critical to the present invention and the thickness may vary depending on the technique used in forming the same. Typically, however, pad oxide layer 14 has a thickness of from about 2 to about 15 nm, with a thickness of from about 4 to about 10 nm being more highly preferred.

Pad nitride layer 16 is then formed on the surface of pad oxide layer 14 utilizing one of the above-mentioned deposition processes, or alternatively, pad nitride layer 16 is formed utilizing a thermal nitridation process. The thickness of pad nitride layer 16 may vary depending on the exact technique employed. Generally, however, the pad nitride layer is thicker than the underlying pad oxide layer.

It is noted that material stack 12 used at this point of the inventive method may include additional layers besides the pad oxide and pad nitride layers mentioned hereinabove. Thus, the present invention is not limited to a material stack which includes only a pad oxide layer and a pad nitride layer.

After sequentially forming pad oxide layer 14 and pad nitride layer 16 on the surface of semiconductor substrate 10, material stack 12 is patterned utilizing conventional lithography and etching so as to provide opening 18 which exposes a surface of semiconductor substrate 10. The lithography step employed in defining opening 18 includes applying a photoresist (not shown) onto the surface of the uppermost layer of the material stack, i.e., pad nitride layer 16, exposing the photoresist to a pattern of radiation, and developing the pattern in the photoresist utilizing a conventional developer. The pattern is then transferred from the photoresist to the material stack by utilizing an etching step which is capable of removing exposed portions of pad nitride layer 16 and pad oxide layer 14.

This etching step may be carried out utilizing a conventional dry etching process such as reactive-ion etching (RIE), plasma etching, ion beam etching or any combination thereof. Thus, a single etching process may be used in removing exposed portions of the pad nitride layer and the underlying pad oxide layer, or multiple etching processes may be employed, wherein a first etching step removes the exposed portions of the nitride layer, and a second etching step is employed in removing the underlying pad oxide layer. Following the etching process, the patterned photoresist is stripped providing the structure shown, for example, in FIG. 1A.

It is noted that although the drawings show the formation of only one opening in the material stack, the present invention also contemplates embodiments wherein a plurality of such openings are formed in the material stack. Each of the openings provided in the material stack define regions in the structure in which the inventive deep slit isolation region will be subsequently formed. Note that the width of the opening in FIG. 1A is labeled as F.

Following the patterning of the material stack and subsequent removal of the photoresist, the exposed portions of substrate 10 in opening 18 is etched so as to provide first trench region 20 in semiconductor substrate 10; See FIG 1B. Note that first trench region 20 has sidewalls 22 that extend to bottom surface 24. The first trench region is etched utilizing a conventional etching process that is highly selective for removal substrate as compared to nitride or oxide. For example, a conventional RIE process may be used in forming first trench region 20 in substrate 10. In accordance with the present invention, first trench region 20 is a shallow trench region, whose depth from the top surface of substrate 10 is on the order of about 300 nm or less, with a depth of from about 100 to about 250 nm being more highly preferred.

After forming the first trench region, first spacers 26 are formed on sidewalls 22 as well as on a portion of bottom surface 24 of first trench region 20 utilizing processing techniques well known to those skilled in the art. For example, the first spacers may be formed by a conventional deposition process and etching. The first spacers are comprised of any insulating material that can withstand high temperatures. One highly preferred insulating material for the first spacers is a CVD oxide. The resultant structure that is formed after the formation of the first trench region and the first spacers is shown, for example, in FIG. 1B.

Figure 1C:
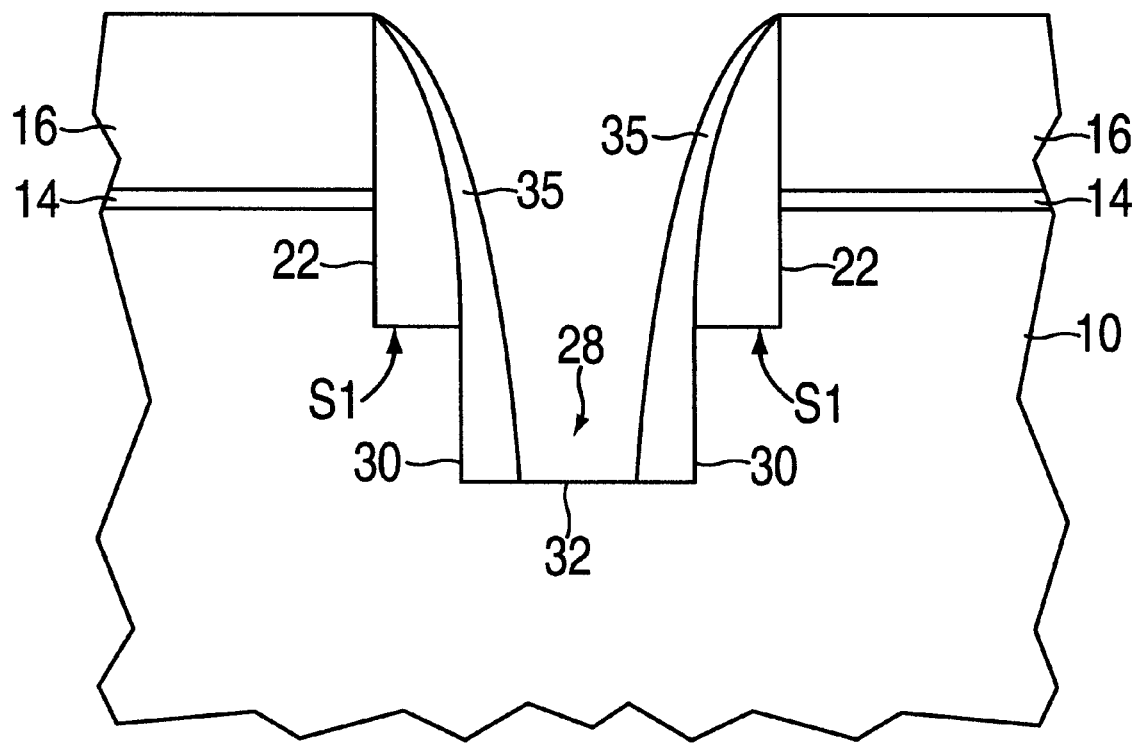

The above etching step and subsequent spacer formation may be repeated any number of times so as to form a plurality of trench regions in substrate 10 which are beneath first trench region 20. The repetition of trench etching and spacer formation is an optional step of the present invention. Because of the presence of the spacers on the sidewalls of the trench region, each successive trench region that is formed will have a smaller width than the preceding trench region. FIG. 1C shows a structure wherein second trench region 28 having sidewalls 30 that extend to bottom surface 32 is formed in the substrate using patterned material stack 12 and first spacers 26 as an etch mask. Note that the spacers formed in each trench region may be comprised of the same or different insulating material, with preference given to spacers that are composed of the same insulating material, e.g., CVD oxide. In FIG. 1C, reference numeral 35 denotes the second spacers that are formed within the trench regions.

Figure 1D:
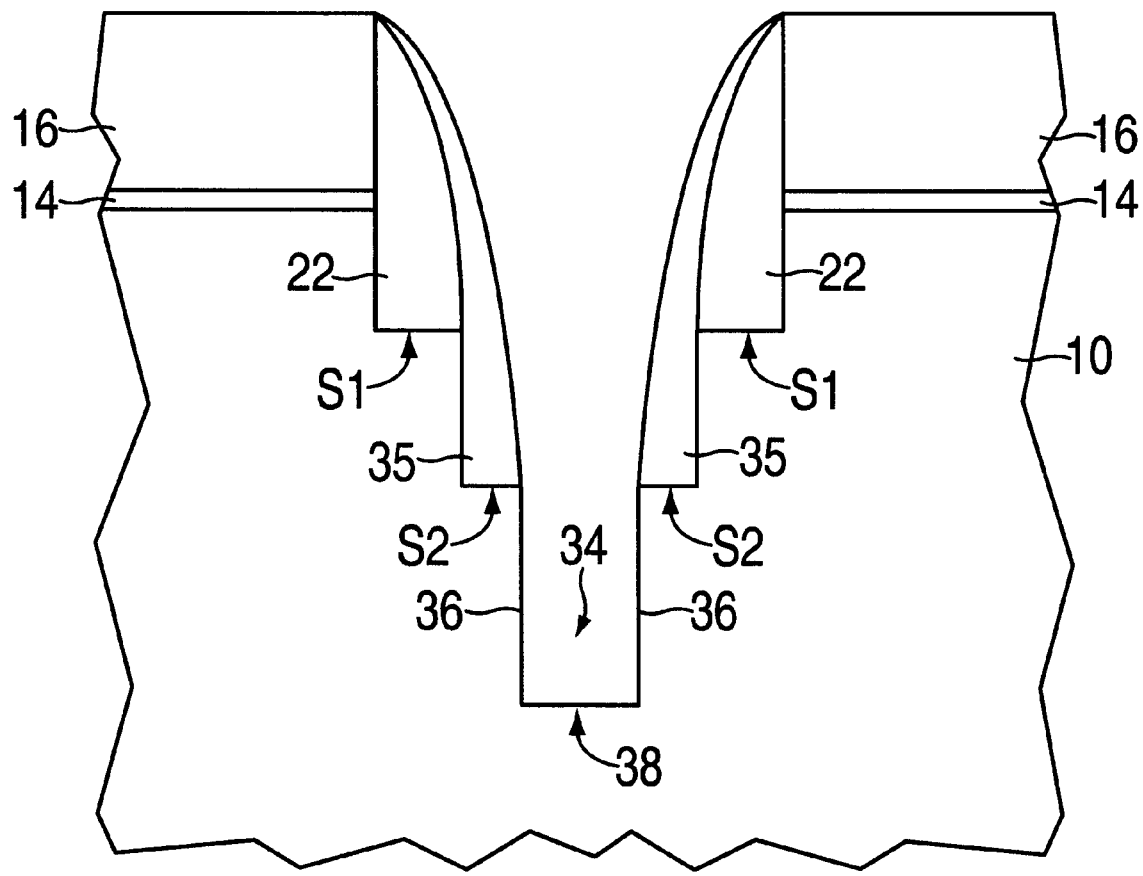
Figure 1E:
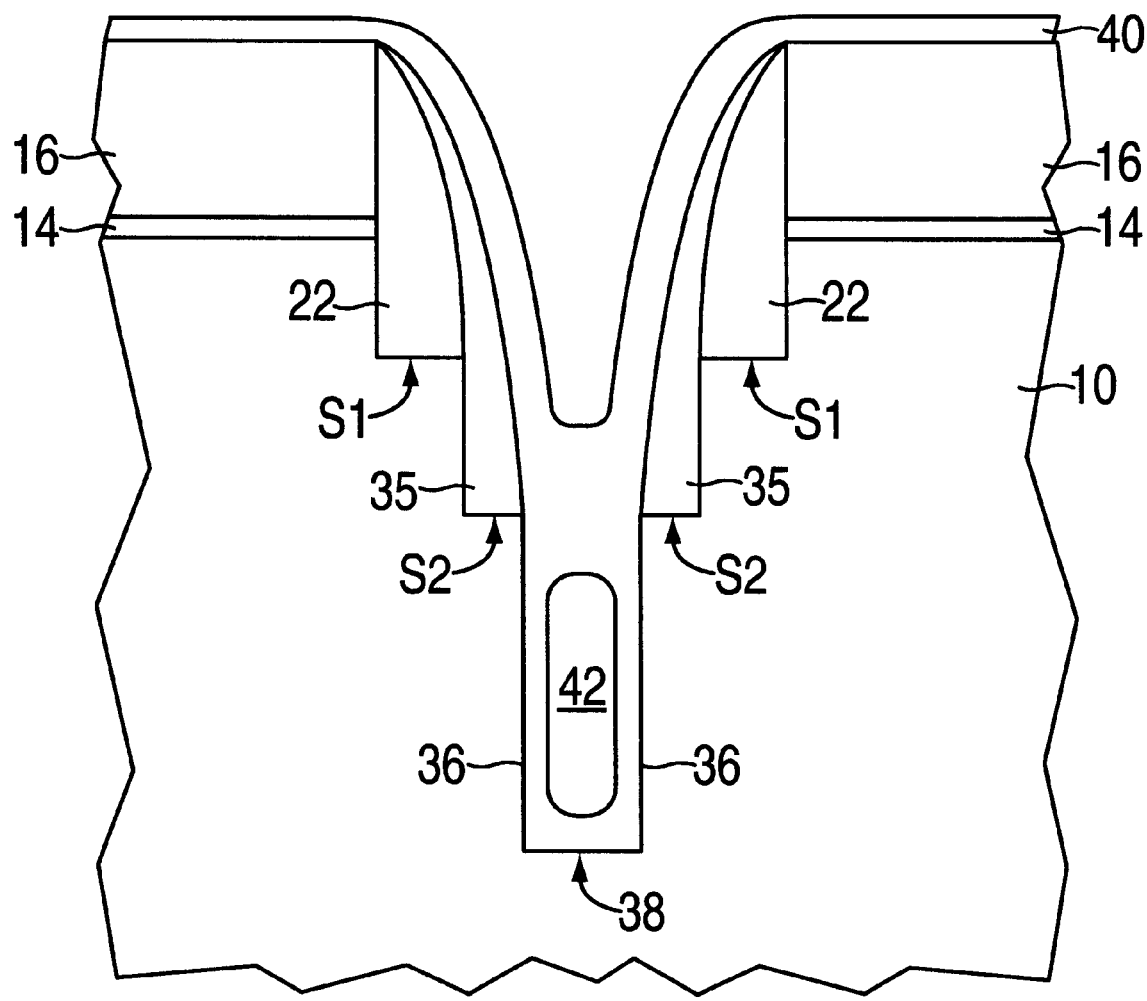

FIG. 1D shows the structure after slit region 34 is formed in the structure. Note that slit region 34 has sidewalls 36 that extend to bottom surface 38, and the width of the slit region is narrower than the corresponding trench region that is present above the slit region. For example, in FIG. 1D, slit region 34 has a width that is narrower than second trench region 28. The slit region is formed in the present invention by utilizing an etching process such as RIE that has a high selectivity for removing semiconductor material as compared to nitride or oxide so as to form the deep slit region in the opening. The term "deep" slit region is used herein to denote an opening (or crevice) in the substrate that has a narrower width than the preceding trench region whose bottom surface is from about 500 to about 3000 nm below the surface of substrate 10.

It is noted that in FIG. 1D shoulder regions, S1, S2, and etc, are formed in the structure. In accordance with the present invention, the shoulder regions of the deep slit isolation region are the remaining portions of the bottom surface of the preceding trench region that has not been etched due to the presence of spacers thereon.

Following the formation of the deep slit region in the substrate, first dielectric material 40 is formed into the opening as well as on the horizontal surfaces of nitride pad layer 16 utilizing a conformal deposition process that is capable of pinching off the first dielectric material so that void 42 is formed within slit region 34. The resultant structure formed after this step of the present invention is shown, for example, in FIG. 1E. In accordance with the present invention, first dielectric material 40 may comprise a silicate glass, tetraethylorthosilicate (TEOS) or other like insulating material. In a highly preferred embodiment, TEOS is employed as the first dielectric material.

In the preferred embodiment wherein TEOS is employed as the first dielectric material, the following deposition conditions using a standard AMA single wafer ozone/TEOS tool are employed:

deposition temperature of from about 350° to about 550° C., with a deposition temperature of about 400° C. being more highly preferred.

base pressure of from about 30 to about 50 torr, with a base pressure of about 40 torr being more highly preferred.

TEOS flow rate of from about 1000 to about 2000 mg/min, with a TEOS flow rate of about 1500 mg/min being more highly preferred.

ozone flow rate of from about 3500 to about 5500 sccm, with an ozone flow rate of about 4500 sccm being more highly preferred.

oxygen flow rate of from about 250 to about 750 sccm, with an oxygen flow rate of about 500 sccm being more highly preferred.

deposition rate of from about 10 to about 20 Å per second, with a deposition rate of from about 12 to about 15 Å per sec being more highly preferred.

thickness range from about 100 to about 1000 Å, with a thickness of from about 200 to about 700 Å being more highly preferred.

deposition time of from about 7 to about 80 seconds, with a deposition time of from about 20 to about 70 seconds being more highly preferred.

It is emphasized that the above deposition conditions are representative conditions that are employed when TEOS is utilized as the first dielectric material. Other deposition conditions are also contemplated in the present invention so long as the other deposition conditions are capable of pinching off first dielectric material 40 so that void 42 is formed within the slit region.

Figure 1F:
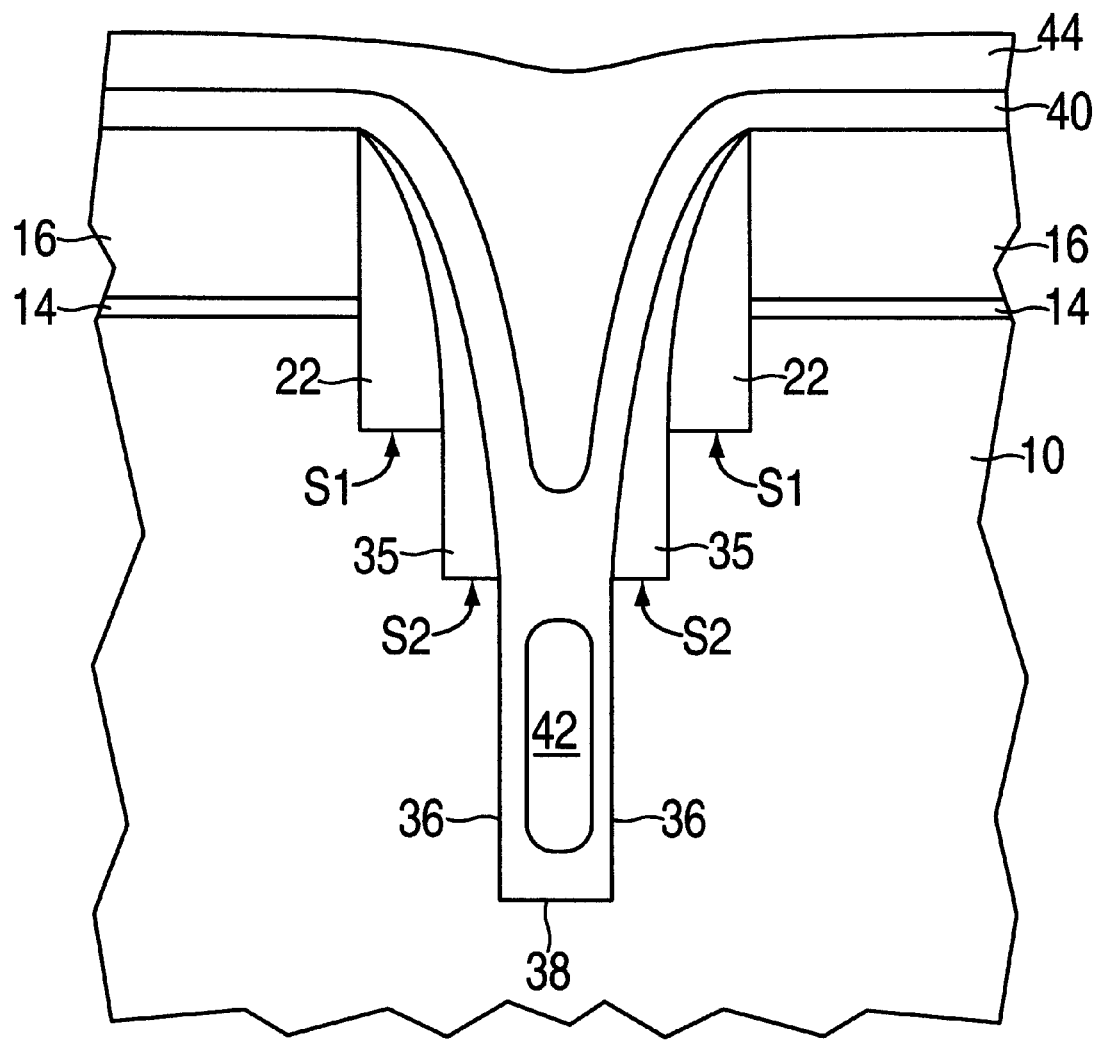
Figure 1G:
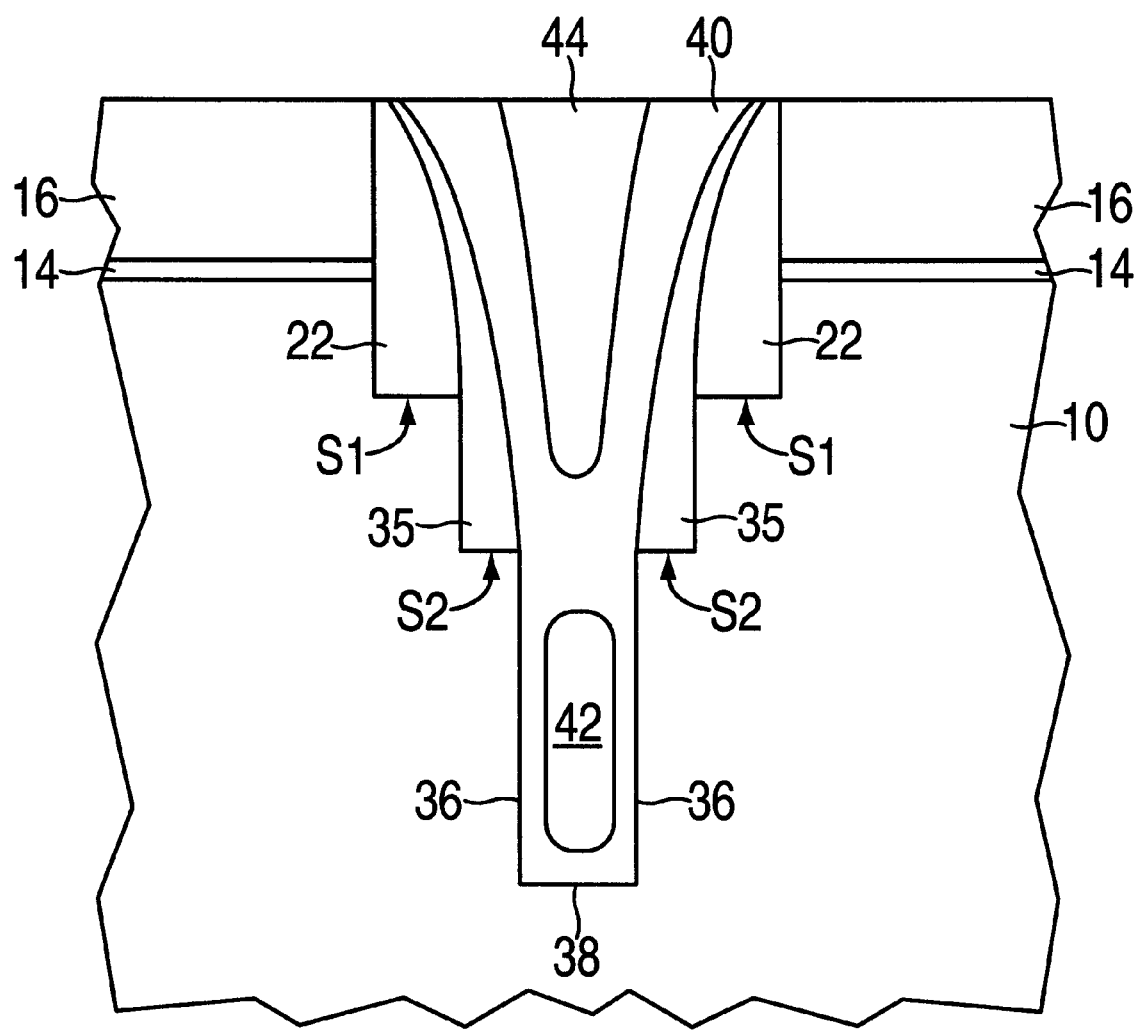

Following the deposition of the first dielectric material in the opening and subsequent formation of void 42 within slit region 34, optional second dielectric material 44 is formed in the opening over first dielectric material 40 and void 42 so as to provide the structure shown, for example, in FIG. 1F. In accordance with the present invention, the second dielectric material may be comprised of the same or different dielectric material as the first dielectric material. In a preferred embodiment, glass is used as the first dielectric material and an oxide or high-plasma density (HDP) oxide is employed as second dielectric material 44.

The second dielectric material may be formed utilizing the same processing conditions as the first dielectric material (preferred when the first and second dielectric material are composed of the same material); or alternatively, a conventional deposition process such as CVD, plasma-assisted CVD, evaporation or sputtering may be used in forming the second dielectric material. Note that when the first and second dielectrics are composed of the same materials no interface or seam would be present between the first and second dielectric materials.

At this point of the present invention, the structure illustrated in FIG. 1F may be planarized utilizing a conventional planarization process such as chemical-mechanical polishing (CMP) or grinding which stops on the upper most surface of pad nitride layer 16 (See FIG. 1G), or alternatively, the planarizing process may be stopped on the uppermost surface of semiconductor substrate 10 (not shown in the drawings).

Following the planarization process, the first and second dielectric used in filling the trench regions (i.e., regions 20 and 28) and slit region 34 may be subjected to a conventional densification process that is well known to those skilled in the art.

It is noted that the inventive deep slit isolation region may be employed in a wide range of applications wherein an isolation region is required to isolate one device region from a neighboring device region. One highly preferred area in which the inventive deep silt isolation region is employed is in memory cells such as DRAM wherein a vertical transistor is present. The application of the inventive deep silt isolation region in a DRAM array will now be discussed in greater detail.

Figure 2A:
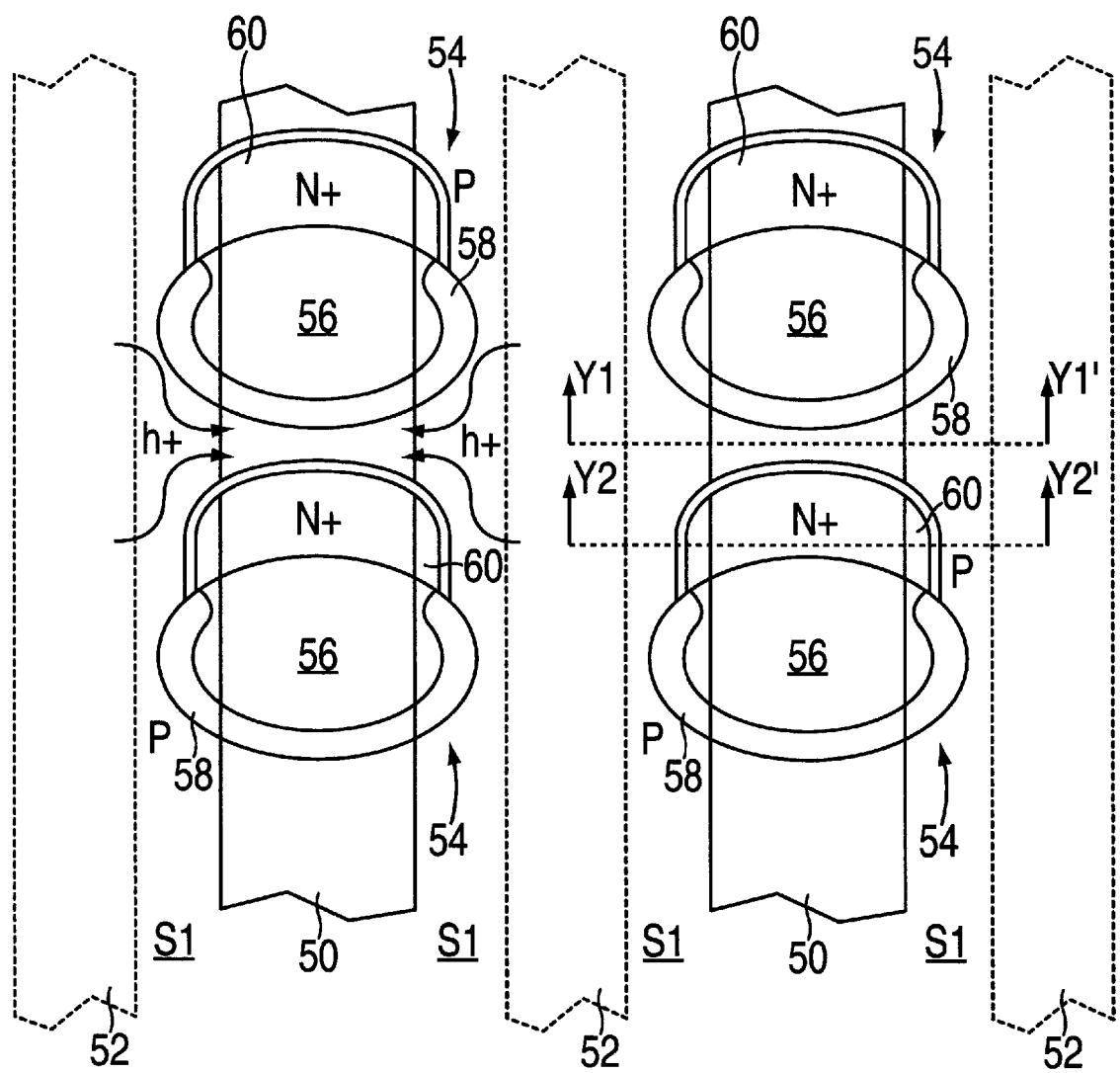
FIG. 2A is a top view of a memory cell which includes the inventive deep slit isolation region therein; in the drawing only one shoulder region is shown.

The method described above may be used in conjunction with conventional processing steps that are capable of forming active areas 50 adjoining the inventive deep slit isolation region (labeled as 52 in FIG. 2A) so as to provide the structure shown in FIG. 2A. Note that a pair of active areas is shown in the drawings and that each active area includes a plurality of spaced apart memory cells 54. Each memory cell includes a gate conductor region 56, a collar region 58 and outdiffused strap region 60. As stated above, the various elements of the active areas are formed utilizing processing steps well known to those skilled in the art; therefore, a detailed description concerning the processing steps used in fabricating the active areas is not needed herein. It is noted that the collar region and the outdiffused strap region may be present on one-side of the trench, as shown in the drawings. In some embodiments, the collar region may be omitted and the outdiffused strap region may be formed on opposing sides of the trench.

In FIG. 2A, P denotes the P-well region formed in the substrate; and h+denotes hole flow to/from the P-well via shoulder region S1. It is noted that in the memory cell array shown in FIG. 2A, floating well effects are avoided and the inventive deep slit isolation regions prevent node-to-node leakage.

Figure 2B:
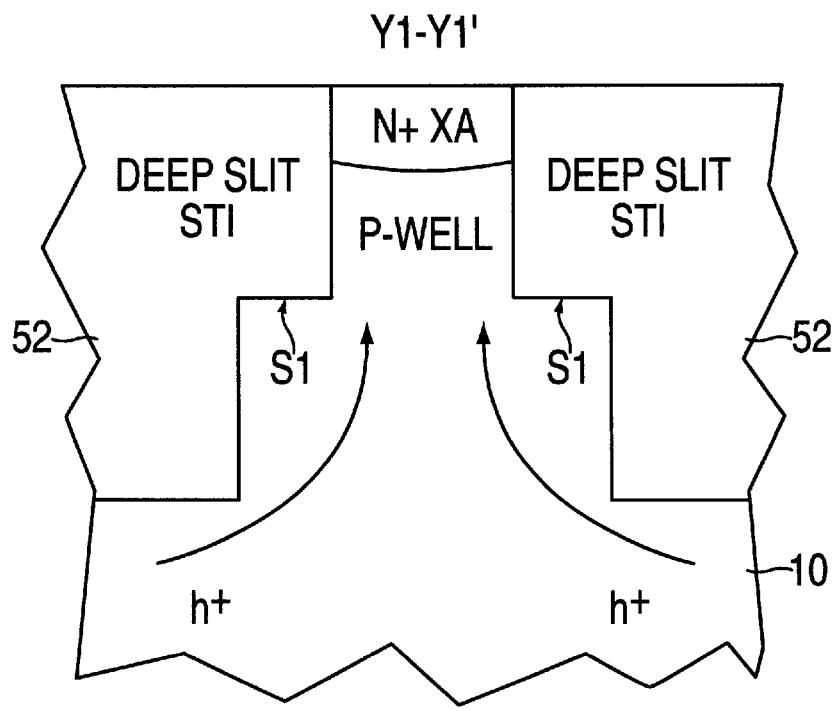
FIGS. 2B–2C are views of the inventive memory cell of FIG. 2A through cuts Y1–Y1' and Y2–Y2', respectively.
Figure 2C:
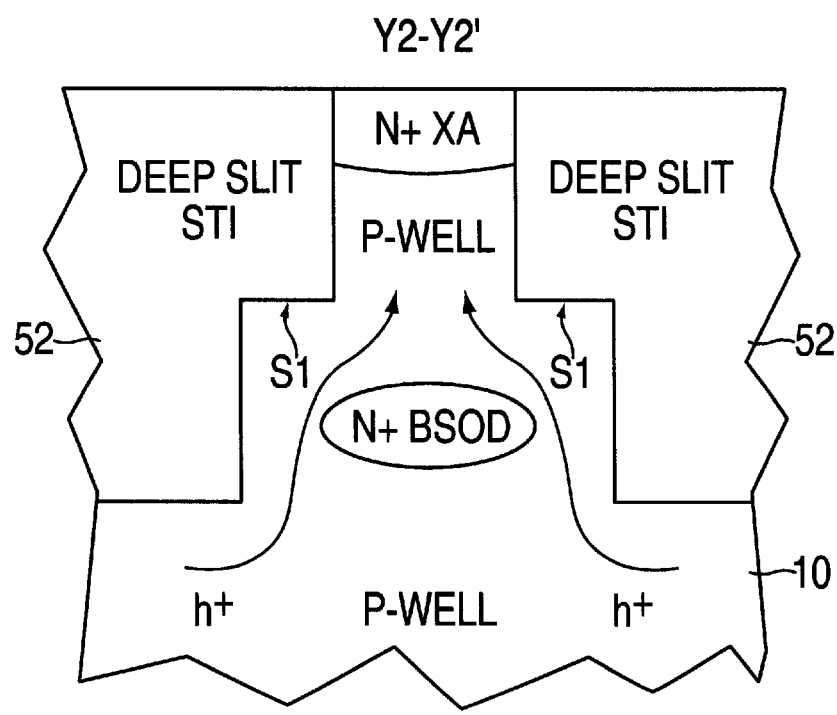

FIGS. 2B and 2C are cross-sectional views of the memory cell array shown in FIG. 2A through cuts Y1–Y1' and Y2–Y2', respectively. In these drawings N+ XA denotes the bitline contact diffusion regions and N+ BSOD represents the buried-strap outdiffusion of the cell.

Figure 3A:
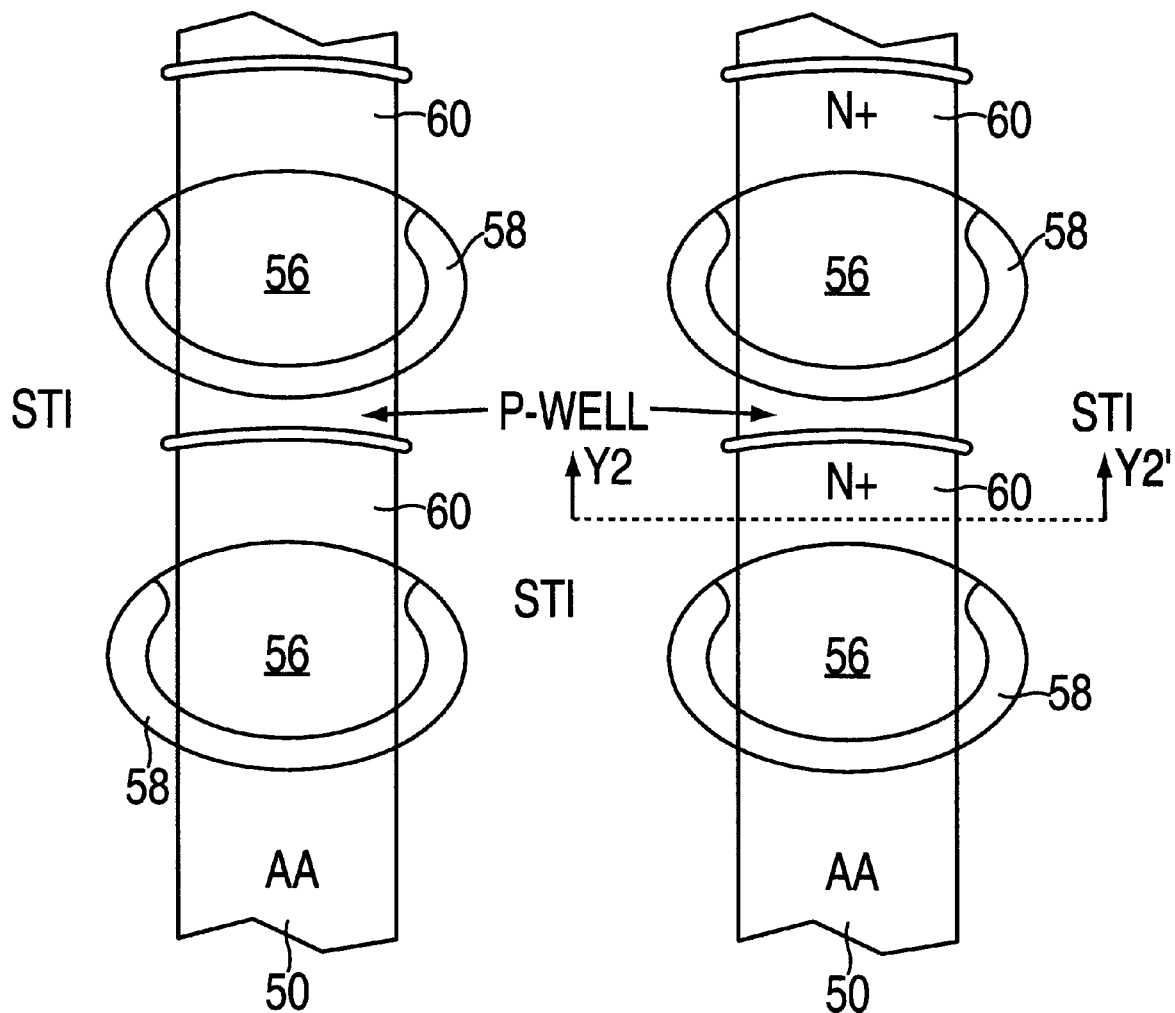
FIGS. 3A–3B are various views of a prior art memory cell; 3A top view; 3B cross-sectional view through cut Y2–Y2'.
Figure 3B:
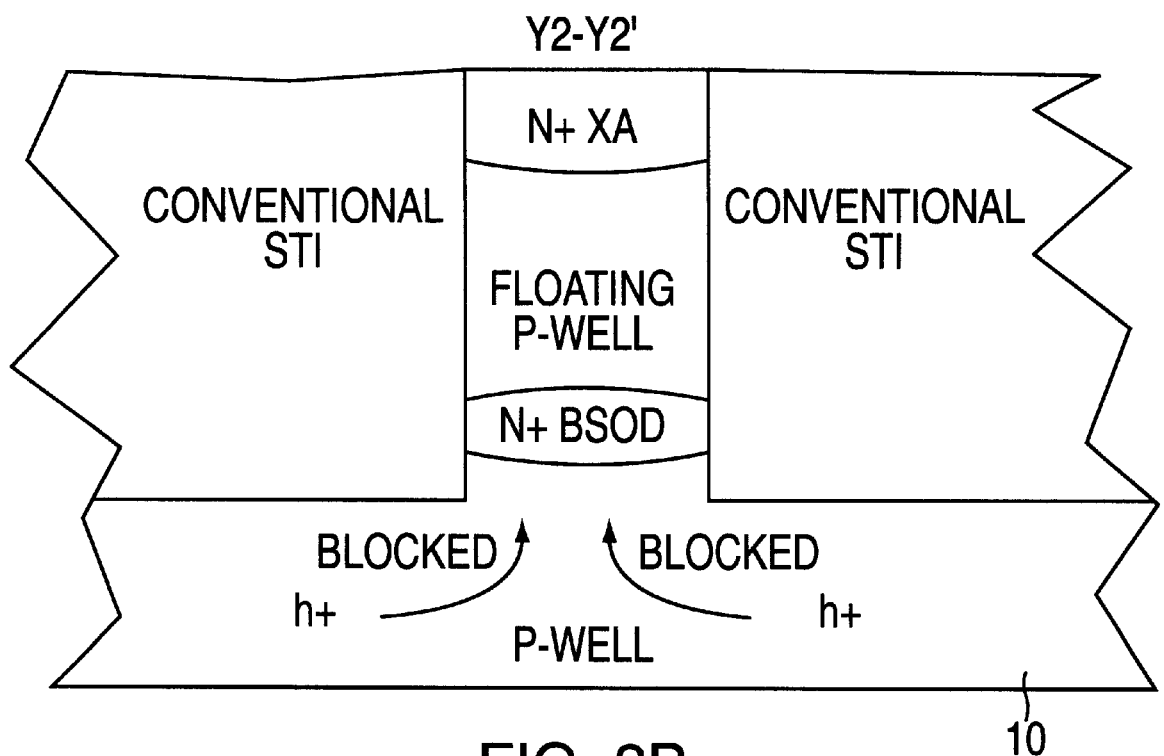

FIGS. 3A–3B are views of a memory cell array that is similar to FIG. 2A except that conventional STI (shallow trench isolation) regions are used to isolate the active areas from each other. Note that in such a layout, the h+ path is blocked. Also, in the prior art memory cell shown in FIGS. 3A–3B, the P-well continuity gets pinched off at small ground rules, the array P-well floats and there is a dynamic charge loss because of this pinch off.

It is emphasized that the use of the inventive deep slit isolation region in memory cell arrays provides the following advantages over existing art in which STI regions are employed as the isolation means: (i) the inventive deep slit isolation provides sub-minimum width/high aspect ratio isolation using minimum litho image size; (ii) the inventive deep slit isolation region enables extreme scaling below F=90 nm of vertical DRAM cells; (iii) the shoulder region present in the inventive deep slit isolation region allows electrical continuity of the array P-well; (iv) the inventive deep slit isolation region avoids charge loss due to floating well effects; (v) the inventive deep slit isolation region provides improved latch-up immunity; (vi) the shoulder region of the inventive deep slit isolation region results in lower sheet resistivity; (vii) the void in the slit region provides low dielectric constant isolation for reduced coupling at small ground rules; and (viii) the void in the slit region provides reduced noise for low-voltage applications.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A deep slit isolation region comprising:
   a first trench region having sidewalls extending to a first shoulder region; and
   a slit region extending from said first shoulder region, wherein said first trench region and said slit region are filled with at least one dielectric material, and said slit region contains a void therein.

2. The deep slit isolation region of claim 1 wherein said first trench region is formed in a semiconductor substrate.

3. The deep slit isolation region of claim 2 wherein said semiconductor substrate is selected from the group consisting of Si, Ge, SiGe, GaAs, InAs, InP, Si/Si, Si/SiGe and silicon-on-insulators.

4. The deep slit isolation region of claim 1 wherein said at least one dielectric material is comprised of TEOS.

5. The deep slit isolation region of claim 1 wherein said at least one dielectric material is comprised of a first dielectric material and a second dielectric material, said dielectric materials each having different compositions.

6. The deep slit isolation region of claim 5 wherein said first dielectric material is comprised of TEOS.

7. The deep slit isolation region of claim 1 wherein said first trench region includes first spacers formed on said first shoulder region.

8. The deep slit isolation region of claim 7 wherein said first spacers are comprised of a CVD oxide.

9. The deep slit isolation region of claim 1 wherein a plurality of trench regions are formed between said first trench region and said slit region, wherein each of said trenches regions have a narrower width than the preceding trench region and said slit region extends from the shoulder region of the last trench region of said plurality.

10. A memory cell array comprising:
    at least a pair of active device regions which include a plurality of spaced apart vertical dynamic random access memory (DRAM) cells, wherein said pair of active device regions are isolated from each other by an adjoining deep slit isolation region, said deep slit isolation region comprising a first trench region having sidewalls extending to a first shoulder region; and a slit region extending from said first shoulder region, wherein said first trench region and said slit region are filled with at least one dielectric material, and said slit region contains a void therein.

11. The memory cell array of claim 10 wherein each of said DRAM cells comprises a gate conductor region and an outdiffused strap region.

12. The memory cell array of claim 10 wherein said first trench region is formed in a semiconductor substrate.

13. The memory cell array of claim 12 wherein said semiconductor substrate is selected from the group consisting of Si, Ge, SiGe, GaAs, InAs, InP, Si/Si, Si/SiGe and silicon-on-insulators.

14. The memory cell array of claim 10 wherein said at least one dielectric material is comprised of TEOS.

15. The memory cell array of claim 10 wherein said at least one dielectric material is comprised of a first dielectric material and a second dielectric material, said dielectric materials each having different compositions.

16. The memory cell array of claim 15 wherein said first dielectric material is comprised of TEOS.

17. The memory cell array of claim 10 wherein said first trench region includes first spacers formed on said first shoulder region.

18. The memory cell array of claim 17 wherein said first spacers are comprised of a CVD oxide.

19. The memory cell array of claim 10 wherein a plurality of trench regions are formed between said first trench region and said slit region, wherein each of said trenches regions have a narrower width than the preceding trench region and said slit region extends from the shoulder region of the last trench region of said plurality.

* * * * *